(12) United States Patent
Satou (10) Patent No.: US 8,232,479 B2
(45) Date of Patent: Jul. 31, 2012

(54) ELECTRONIC APPARATUS

(75) Inventor: Hisashi Satou, Kirishima (JP)

(73) Assignee: Kyocera Corporation, Kyoto (JP)

( * ) Notice: Subject to any disclaimer, the term of this patent is extended or adjusted under 35 U.S.C. 154(b) by 277 days.

(21) Appl. No.: 12/826,423

(22) Filed: Jun. 29, 2010

(65) Prior Publication Data

US 2011/0024175 A1 Feb. 3, 2011

(30) Foreign Application Priority Data

Jul. 29, 2009 (JP) ................................. 2009-176066
Oct. 28, 2009 (JP) ................................. 2009-247278

(51) Int. Cl.
*H05K 1/16* (2006.01)
*H01G 4/12* (2006.01)
*H01G 9/00* (2006.01)

(52) U.S. Cl. ................... 174/260; 174/126.1; 174/126.4; 361/303; 361/306.3; 361/321.4; 361/760; 361/763

(58) Field of Classification Search .......... 174/250–267, 174/126.1–126.4; 361/301–313, 346, 363, 361/366, 321.2, 321.4, 321, 301.5, 308.1, 361/760–767, 738, 756; 29/25.03, 25.41, 29/25.42, 825–852; 257/532; 336/83, 192, 336/200

See application file for complete search history.

(56) References Cited

U.S. PATENT DOCUMENTS

| 5,401,910 | A  | * | 3/1995 | Mandai et al. ................ | 174/250 |
| 6,069,786 | A  | * | 5/2000 | Horie et al. .................... | 361/303 |
| 7,019,958 | B2 | * | 3/2006 | Togashi et al. ................ | 361/303 |
| 7,113,389 | B2 | * | 9/2006 | Ishifune et al. ............ | 361/306.3 |
| 7,414,857 | B2 | * | 8/2008 | Ritter et al. .................... | 361/756 |
| 7,697,262 | B2 | * | 4/2010 | Ritter et al. ................ | 361/306.1 |
| 7,741,565 | B2 | * | 6/2010 | Matsutani et al. ......... | 174/126.1 |
| 7,948,737 | B2 | * | 5/2011 | Togashi et al. ............. | 361/306.3 |

FOREIGN PATENT DOCUMENTS

JP 2008-192808 8/2008

\* cited by examiner

*Primary Examiner* — Michail V Datskovskiy
(74) *Attorney, Agent, or Firm* — DLA Piper LLP (US)

(57) ABSTRACT

There is provided an electronic apparatus capable of ESL reduction. The electronic apparatus includes a capacitor and a mounting board. The capacitor includes a multilayer body, an internal electrode, and a terminal electrode. The mounting board has a connection pad formed on its upper surface and has a through conductor formed inside thereof that is connected to the connection pad. The capacitor is mounted on the mounting board by connecting the terminal electrode to the connection pad. The internal electrode has an end portion exposed at an area ranging from an end face to a middle portion of a lateral face in the multilayer body. In a planar view, the through conductor is located immediately below a part of the end portion of the internal electrode exposed at the lateral face of the multilayer body, the part lying furthermost from the end face.

3 Claims, 5 Drawing Sheets

ELECTRONIC APPARATUS

BACKGROUND OF THE INVENTION

1. Field of the Invention

The present invention relates to an electronic apparatus having a constitution that a capacitor is mounted on a mounting board, and more particularly to an improvement in inductance reduction of the electronic apparatus.

2. Description of the Related Art

Recently there has been a trend for communications equipment such as a cellular phone and information processing equipment such as a personal computer to be adapted to increasingly faster signals to deal with a huge amount of information. In keeping with this trend a CPU (Central Processing Unit) used in such equipment has come to operate at an increasingly higher clock frequency, wherefore harmonic noise is likely to occur. Furthermore, due to the presence of for example external noise resulting from peripheral apparatuses, circuits, and so forth of the aforementioned information processing equipment, the voltage supplied to the CPU is prone to contain a high proportion of noise.

Furthermore, there exists impedance in a power supply line for feeding a voltage to the CPU, etc. and ground. Therefore, in a case where the voltage supplied to the CPU, etc. contains noise, since voltage fluctuation occurs in the power supply line, it follows that a stable voltage is no longer supplied to the CPU, etc. This gives rise to problems including lack of stability in the workings of circuitry mounting the CPU, etc., occurrence of interference between different circuits through a circuit for feeding a voltage to the CPU, etc., and occurrence of oscillation.

In view of the foregoing, it is customary to connect a decoupling capacitor between the power supply line and ground. Moreover, the use of a capacitor having excellent impedance frequency characteristics is effective in obtaining enhanced decoupling effect. In this regard, a multilayer ceramic capacitor is smaller than an electrolytic capacitor in terms of ESR (Equivalent Series Resistance) and ESL (Equivalent Series Inductance (L)) as well. The multilayer ceramic capacitor is thus suitable for use as a decoupling capacitor. This is because, when ESL is small, the impedance existing in the power supply line and ground can be lowered, in consequence whereof there results no voltage fluctuation. Moreover, in a capacitor with small ESL, excellent noise absorption effect can be obtained over a wide frequency band. In order to enhance the decoupling effect of the capacitor, further ESL reduction will be necessary.

In that connection, in an electronic apparatus including a capacitor and a mounting board disclosed in Japanese Unexamined Patent Publication JP-A 2008-192808, the capacitor is composed of a multilayer body constituted of a plurality of insulating layers stacked on top of each other, an internal electrode formed within the multilayer body, and a terminal electrode formed on the outer surface of the multilayer body so as to be electrically connected to the internal electrode. The mounting board is composed of a board main body having a mounting surface, a connection pad formed on the mounting surface, and a through conductor formed within the board main body so as to be electrically connected to the connection pad. The internal electrode of the capacitor and the connection pad of the mounting board are disposed in face-to-face relation with each other. With the terminal electrode and the connection pad kept in an electrically-connected state, the capacitor is mounted on the mounting board. The through conductor is so disposed that, when projected on a virtual plane extending in a direction perpendicular to the mounting surface, or a direction in which the internal electrode of the capacitor is led out, an electric current flowing through the internal electrode is opposite in direction to an electric current flowing from the connection pad to the through conductor or an electric current flowing from the through conductor to the connection pad.

In the electronic apparatus thereby constructed, a magnetic field produced around the electric current flowing through the internal electrode and a magnetic field produced around the electric current flowing through the connection pad cancel each other out effectively, with consequent ESL reduction.

Incidentally, in the electronic apparatus as disclosed in JP-A 2008-192808, in order for the electric current flowing through the internal electrode to be opposite in direction to the electric current flowing through the connection pad in a planar view, the through conductor is so formed as to lie as close as possible to a side (hereafter referred to as "inner side") of the connection pad in a planar view that is opposed to a side situated toward the end face of the terminal electrode mounted on the connection pad connected with the through conductor.

However, in the electronic apparatus as disclosed in JP-A 2008-192808, in the case of forming the through conductor in the vicinity of the inner side of the connection pad in a planar view, there is provided an extra current path extending from the vicinity of the inner side of the connection pad to a point immediately below that part of an end of the internal electrode which is exposed at the end face of the multilayer body in a planar view. Accordingly, even if magnetic field cancellation takes place, the influence of an increase in the length of the current path is unavoidable. This gives rise to a problem of an undesirable increase in ESL of the electronic apparatus.

SUMMARY OF THE INVENTION

The invention has been devised in view of the above-described problems associated with the conventional art, and accordingly its object is to provide an electronic apparatus capable of ESL reduction.

In a first aspect of the invention, an electronic apparatus comprises a capacitor and a mounting board. The capacitor comprises a multilayer body, an internal electrode, and a terminal electrode. The multilayer body is constituted of a plurality of rectangular dielectric layers stacked on top of each other. The internal electrode is formed between the dielectric layers of the multilayer body. The terminal electrode is formed at both ends of the multilayer body and is connected to the internal electrode. The mounting board comprises a connection pad on a first main surface thereof. In addition, the mounting board comprises a through conductor and is formed inside thereof. The capacitor is mounted on the mounting board by connecting the terminal electrode to the connection pad of the mounting board. The through conductor of the mounting board is connected to the connection pad. The internal electrode comprises an end portion exposed at an area ranging from an end face to a middle portion of a lateral face in the multilayer body. The through conductor is located immediately below a part of the end portion of the internal electrode exposed at the lateral face of the multilayer body in a planar view, the part lying furthermost from the end face.

According to the first aspect of the invention, in the electronic apparatus in which the capacitor is mounted on the first main surface of the mounting board, the internal electrode comprises an end portion exposed at an area ranging from an end face to a middle portion of a lateral face in the multilayer body, and the through conductor is located immediately below a part of the end portion of the internal electrode exposed at the lateral face of the multilayer body in a planar view, the part lying furthermost from the end face. In this construction, in a planar view, upon flowing of an electric current from the through conductor to the connection pad, the electric current passes through the location immediately below the exposed end portion of the internal electrode. This helps reduce the length of the path over which the electric current flows through the terminal electrode into the internal electrode. Moreover, the interval between a point at which the electric current flows into the internal electrode and a terminal electrode opposite from a terminal electrode through which the electric current passes before flowing into the internal electrode is reduced. As a result, the overall current path can be shortened, with consequent ESL reduction in the electronic apparatus.

In a second aspect of the invention, an electronic apparatus comprises a multilayer circuit board and a capacitor. The multilayer circuit board comprises an insulating base body, internal conductors, and a through conductor. The insulating base body is constituted of a plurality of insulating layers stacked on top of each other. The internal conductors are formed between the insulating layers. The through conductor is so configured to pass all the way through the insulating layers so as to electrically connect the internal conductors each formed between different ones of the plurality of insulating layers. The multilayer circuit board is composed of a first multilayer circuit block, a second multilayer circuit block, and a third multilayer circuit block. The first multilayer circuit block is formed with a rectangular through hole. The second multilayer circuit block is disposed on a first main surface of the first multilayer circuit block. The third multilayer circuit block is disposed on a second main surface of the first multilayer circuit block. The third multilayer circuit block comprises a connection pad on a first main surface thereof and a through conductor which is formed inside thereof. The through conductor is connected to the connection pad. The capacitor is placed in the through hole of the multilayer circuit board.

The capacitor comprises a multilayer body, an internal electrode, and a terminal electrode. The multilayer body is constituted of a plurality of rectangular dielectric layers stacked on top of each other. The internal electrode is formed between the dielectric layers of the multilayer body, with an end portion exposed at an area ranging from an end face to a middle portion of a lateral face in the multilayer body. The terminal electrode is formed at both ends of the multilayer body and is connected to the internal electrode. The terminal electrode extends to the first main surface of the multilayer body so as to make connection with the connection pad. In the third multilayer circuit block, in a planar view, the through conductor electrically connected to the connection pad is located immediately above a part of the end portion of the internal electrode exposed at the lateral face of the multilayer body of the capacitor, the part lying furthermost from the end face.

According to the second aspect of the invention, just as is the case with the electronic apparatus pursuant to the first aspect of the invention, the length of the path over which an electric current flows from the through conductor into the internal electrode of the capacitor can be reduced. This makes it possible to achieve ESL reduction in the electronic apparatus.

Moreover, since the capacitor is not placed on the multilayer circuit board but placed in the through hole formed within the multilayer circuit board, it is possible to mount another electronic component on the multilayer circuit board. This allows electronic components to be mounted in a denser arrangement than ever.

BRIEF DESCRIPTION OF THE DRAWINGS

Other and further objects, features, and advantages of the invention will be more explicit from the following detailed description taken with reference to the drawings wherein.

DETAILED DESCRIPTION

Now referring to the drawings, preferred embodiments of an electronic apparatus according to the invention will be described in detail.

Figure 1:
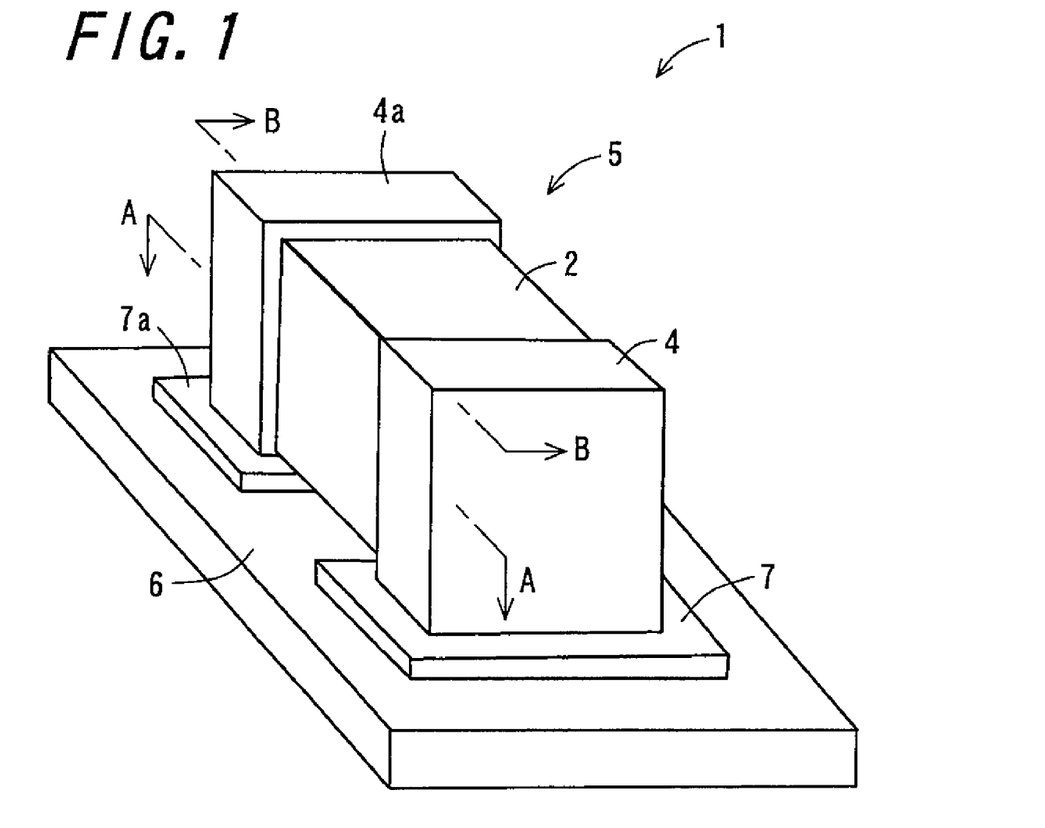
FIG. 1 is a perspective view showing an electronic apparatus in accordance with a first embodiment of the invention.
Figure 2:
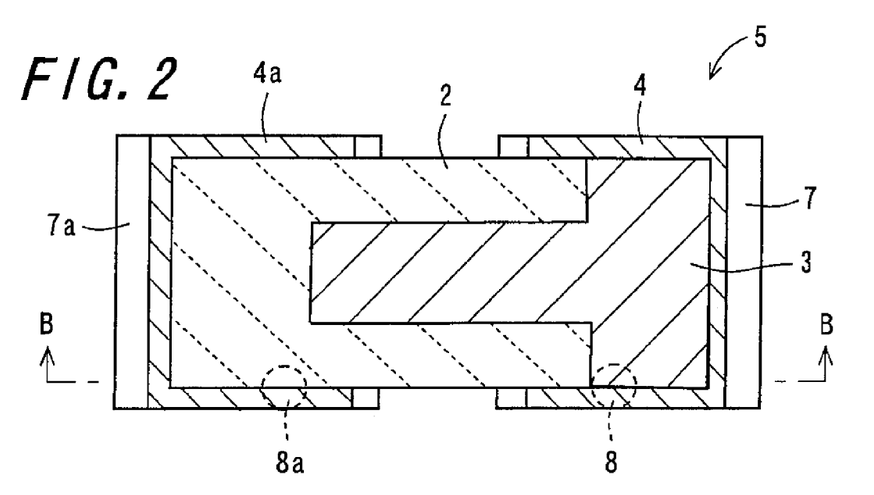
FIG. 2 is a sectional view of a capacitor shown in FIG. 1 taken along the line A-A thereof.
Figure 3:
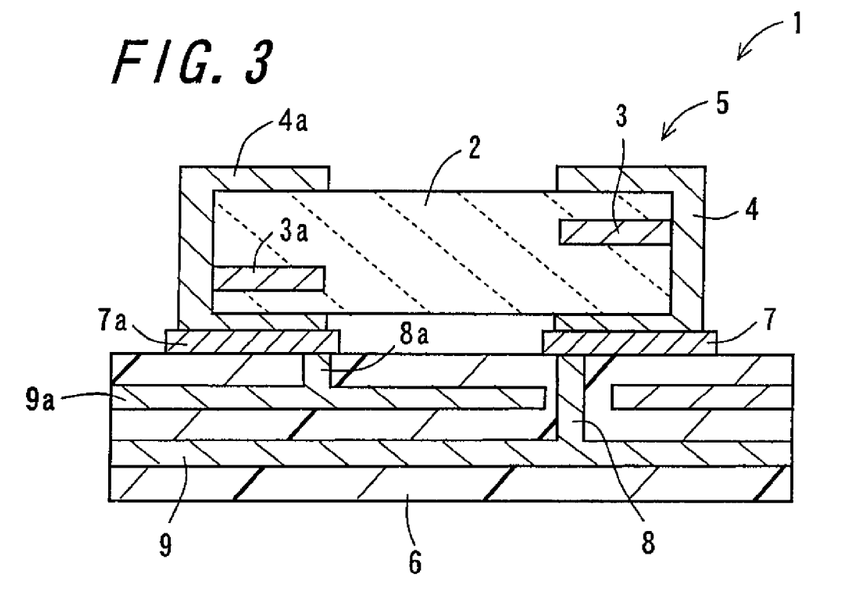
FIG. 3 is a sectional view of the electronic apparatus shown in FIG. 1 and the capacitor shown in FIG. 2 taken along the line B-B thereof.

FIG. 1 is a perspective view showing an electronic apparatus in accordance with a first embodiment of the invention. FIG. 2 is a sectional view of a capacitor 5 shown in FIG. 1 taken along the line A-A thereof. FIG. 3 is a sectional view of the electronic apparatus 1 shown in FIG. 1 and the capacitor 5 shown in FIG. 2 taken along the line B-B thereof.

The electronic apparatus 1 shown in FIG. 1 comprises a capacitor 5 and a mounting board 6. The capacitor 5 comprises a multilayer body 2, internal electrodes 3 and 3a, and terminal electrodes 4 and 4a. The multilayer body 2 is constituted of a plurality of rectangular dielectric layers stacked on top of each other. The internal electrode 3, 3a is formed between the dielectric layers of the multilayer body 2. The terminal electrode 4, 4a is formed at each end portion of the multilayer body 2 and is connected to the internal electrode 3, 3a. The mounting board 6 comprises connection pads 7 and 7a formed on its upper surface which is defined as a first main surface. In addition, the mounting board 6 comprises through conductors 8 and 8a formed inside thereof. The capacitor 5 is mounted on the mounting board 6 by connecting the terminal electrode 4, 4a to the connection pad 7, 7a of the mounting board 6. The through conductor 8, 8a of the mounting board 6 is connected to the connection pad 7, 7a. The internal electrode 3, 3a comprises an end portion exposed at an area ranging from an end face to a middle portion of a lateral face in the multilayer body 2. In a planar view, the through conductor 8, 8a is located immediately below a part of the end portion of the internal electrode 3, 3a exposed at the lateral face of the multilayer body 2, the part lying furthermost from the end face.

In this construction, in a planar view, upon flowing of an electric current from the through conductor 8, 8a to the connection pad 7, 7a, the electric current passes through the location immediately below the end portion of the internal electrode 3, 3a exposed at the surface of the multilayer body 2. Therefore, the length of the path over which an electric current flows through the terminal electrode 4 into the internal electrode 3 can be reduced. It is also possible to reduce the interval between the point at which the electric current flows into the internal electrode 3 and the terminal electrode 4a, namely the terminal electrode opposite from the terminal electrode 4 through which the electric current passes before flowing into the internal electrode 3, as well as the interval between the point at which the electric current flows into the internal electrode 3a and the terminal electrode 4, namely the terminal electrode opposite from the terminal electrode 4a through which the electric current passes before flowing into the internal electrode 3a. As a result, the overall current path can be shortened with consequent ESL reduction.

The capacitor 5 comprises: the multilayer body 2 constituted of a plurality of dielectric layers stacked on top of each other; the internal electrodes 3 and 3a formed between the dielectric layers of the multilayer body 2; and the terminal electrodes 4 and 4a which are formed at opposite ends of the multilayer body 2 and are connected to the internal electrodes 3 and 3a, respectively.

The multilayer body 2 of the capacitor 5 is a rectangular parallelepiped-shaped dielectric block constituted of a stacked plurality of, for example, 20 to 2000 pieces of rectangular dielectric layers, of which each has a thickness of 1 μm to 5 μm.

Where the dimension of the multilayer body 2 is concerned, for example, the length of a longer side falls in the range of approximately 0.2 mm to 5 mm, and the multilayer body 2 has an approximately 2 to 1 longer-side to shorter-side ratio under normal circumstances.

As a material for the dielectric layer, for example, a dielectric material composed predominantly of ceramic having a relatively high dielectric constant, such as barium titanate, calcium titanate, and strontium titanate, is used.

The internal electrode 3, 3a of the capacitor 5 is formed between the dielectric layers of the multilayer body 2, and the number of layers thereof falls in the range of 20 to 2000. As a material for the internal electrode 3, 3a, for example, a conductor material composed predominantly of metal such as nickel, copper, silver, and palladium is used. Each internal electrode layer has a thickness of between 0.5 μm and 2 μm.

Moreover, the internal electrode 3, 3a comprises an end portion exposed at the area ranging from the end face to a middle portion of a lateral face in the multilayer body 2. That is, as shown in FIG. 2, the internal electrode 3 is formed in a T-shape in a planar view. A part of the internal electrode 3 which is exposed at the end face and the lateral face of the multilayer body 2 is connected to the terminal electrode 4. Note that while the internal electrode 3 illustrated in FIG. 2 is connected to the terminal electrode 4 shown in the right-hand part of FIG. 2, the next internal electrode 3a located above or below the layer corresponding to the internal electrode 3 shown in FIG. 2 is formed at the side of the end portion opposite from the end portion formed with the internal electrode 3 shown in FIG. 2; that is, the internal electrode 3 and the internal electrode 3a are opposite in orientation to each other. The internal electrode 3a is connected to the terminal electrode 4a shown in the left-hand part of FIG. 2.

Note that at least one internal electrode 3 and at least one internal electrode 3a are connected to the terminal electrode 4 and the terminal electrode 4a, respectively, that are formed at opposite ends of the multilayer body 2. That is, at least a pair of internal electrodes 3 and 3a are disposed at both ends of the multilayer body 2.

Moreover, the general dimension of the internal electrode 3, 3a will be given below.

In the multilayer body 2 of the embodiment shown in FIG. 2 in a planar view, assuming that a direction parallel to the longer side (lateral-face side) thereof is a lateral direction and a direction parallel to the shorter side (end-face side) thereof is a longitudinal direction, then the lateral length of the internal electrode falls in the range of approximately 0.2 mm to 5 mm, for example. The longitudinal length of that part of the internal electrode which is connected to the terminal electrode 4 falls in the range of approximately 0.19 mm to 4.9 mm. The longitudinal length of that part of the internal electrode which is located near the midportion of the interior of the multilayer body 2 falls in the range of approximately 0.1 mm to 2.5 mm. Moreover, in the entire internal electrode 3, the length of its end portion exposed at the lateral face only of the multilayer body 2 falls in the range of approximately 0.1 mm to 4 mm in the lateral direction.

The terminal electrodes 4 and 4a of the capacitor 5 are formed at opposite ends of the multilayer body 2 and are connected to the internal electrodes 3 and 3a, respectively. The terminal electrode 4, 4a is provided to allow the capacitor 5 to make electrical connection with an external circuit. In the electronic apparatus 1 of the invention shown in FIG. 1, the terminal electrode 4, 4a of the capacitor 5 is mounted on and connected to the connection pad 7, 7a placed on the mounting board 6. Moreover, as shown in FIG. 2, the terminal electrode 4 is connected to the end portion of the internal electrode 3 exposed at the surface of the multilayer body 2.

Moreover, the terminal electrodes 4 and 4a taken as a pair are formed at opposite ends of the multilayer body 2.

Note that the terminal electrode 4, 4a is connected to the internal electrode 3, 3a in such a way as to cover the end of the internal electrode 3, 3a exposed at the surface of the multilayer body 2. In this construction, since a part of the internal electrode 3, 3a which is exposed at the surface of the multilayer body 2 disappears from sight, it is possible to ensure electrical insulation between the capacitor and an external apparatus.

The method of forming the terminal electrode 4, 4a involves a step of printing a paste made of copper powder and binder resin to a porcelain base body so that the film thickness falls in the range of 10 μm to 50 μm by means of dipping coating or otherwise and a step of baking the paste by applying heat for 1 hour at a temperature of approximately 900° C.

The capacitor 5 having the structure thus far described is constructed by a ceramic green sheet lamination method as set forth hereunder.

Specifically, at first, a suitable organic solvent or the like is added and admixed in ceramic raw powder to form a ceramic slurry, and the ceramic slurry is shaped into ceramic green sheets by a doctor blade method, for example.

Next, patterns of the internal electrodes 3 and 3a are formed in the thereby obtained ceramic green sheets by means of screen printing or otherwise. The ceramic green sheets are then stacked on top of and bonded to each other under pressure thereby to form a molded laminate of the multilayer body 2.

Next, the molded laminate of the multilayer body 2 is divided into pieces of predetermined size, followed by firing under a temperature condition of 800 to 1050° C. In this way, the multilayer body 2 in a sintered state is obtained.

Next, the multilayer body 2 thereby obtained is chamfered by means of barrel finishing or otherwise for the purpose of removing microcracks and preventing chipping.

Next, with use of a paste made of copper powder and binder resin, an electrically conductive paste is applied to each end face of the multilayer body 2 so that the film thickness falls in the range of 10 μm to 50 μm by means of dipping coating or otherwise. The electrically conductive paste is baked for 1 hour at approximately 900° C. to form the terminal electrodes 4 and 4a.

Next, a plating layer such as a nickel (Ni) plating layer, a gold (Au) plating layer, a tin (Sn) plating layer, or a solder plating layer is formed on the surface of the terminal electrode 4, 4a, on an as needed basis. In this way, the capacitor 5 is obtained.

Meanwhile, the mounting board 6 comprises the connection pads 7 and 7a formed on its upper surface and the through conductors 8 and 8a formed inside thereof.

For example, the mounting board 6 is constructed of a printed wiring board formed by impregnating glass cloth with epoxy resin or by adding glass filler to epoxy resin.

The connection pads 7 and 7a and the through conductors 8 and 8a are provided to electrically connect the capacitor 5 mounted on the mounting board 6 and a terminal of other different component. Specifically, the connection pad 7, 7a and one end portion of the through conductor 8, 8a are connected to each other at a surface part of the mounting board 6, and the other end portion of the through conductor 8, 8a is connected to an internal conductor 9, 9a formed within the mounting board 6 (refer to FIG. 3). Moreover, the internal conductor 9, 9a is, at its another area, connected to one end portion of other different through conductor. The other end portion of this through conductor is connected to other different connection pad formed on the mounting board 6. This connection pad is connected with a terminal of other component than the capacitor 5. In this way, the capacitor 5 is electrically connected to a different electronic component.

Where the dimension of the connection pad 7, 7a is concerned, in the multilayer body 2 in a planar view, assuming that a direction parallel to the longer side (lateral-face side) thereof is a lateral direction and a direction parallel to the shorter side (end-face side) thereof is a longitudinal direction, then the lateral length of the connection pad falls in the range of approximately 0.1 mm to 5 mm and the longitudinal length thereof falls in the range of approximately 0.1 mm to 5 mm, for example.

Moreover, the through conductor 8, 8a ranges in diameter approximately from 30 μm to 200 μm in a planar view.

Moreover, the connection pad 7, 7a, the through conductor 8, 8a, and the internal conductor 9, 9a can be formed by using a conductor material made of Ag or an alloy composed predominantly of Ag such as a silver-platinum (Ag—Pt) alloy, or a conductor material made of copper (Cu) or an alloy composed predominantly of Cu such as a copper-zinc (Cu—Zn) alloy, a copper-tin (Cu—Sn) alloy, a copper-silver (Cu—Ag) alloy, or a copper-nickel (Cu—Ni) alloy. Note that the connection pad 7, 7a may have its surface coated with a plating film on an as needed basis.

Further, the connection pad 7, 7a and the internal conductor 9, 9a are formed on the surface and in the interior, respectively, of the printed wiring board by, for example, a method of subjecting an electrically conductive metal such as Cu and Ag to plating process, a method of bonding metal foil formed in predetermined wiring-conductor and ground-wiring patterns, or a method of removing unnecessary portions from a substrate whose entire surface is covered with metal foil by means of etching.

Such a mounting board 6 is fabricated as follows. For example, a commercially available copper-clad substrate, the obverse and reverse sides of which are both entirely covered with copper foil, is prepared for use. This copper-clad substrate is cut into pieces of predetermined size, and the copper foil deposited on the surface thereof is etched in predetermined patterns by means of acidic solution such as dilute hydrochloric acid. Note that through holes are formed in the mounting board 6 on an as needed basis by means of laser light or a drill, and a metal paste is charged into the through holes. By the application of heat and curing treatment, the through conductors 8 and 8a can be formed.

Moreover, as shown in FIGS. 2 and 3, in a planar view, the through conductor 8, 8a is located immediately below a part of the end portion of the internal electrode 3, 3a exposed at the lateral face of the multilayer body 2, the part lying furthermost from the end face.

Herein, the through conductor 8, 8a indicated by a circle of a broken line in FIG. 2 is not present on the surface of the section illustrated in FIG. 2 but is formed within the mounting board 6 as shown in FIG. 3. Moreover, although, in FIG. 2, the connection pad 7, 7a is not present on the surface of the section illustrated in FIG. 2 but is formed on the mounting board 6 in reality, these components are depicted in the same figure for the sake of explanation.

By virtue of such a structure, in a planar view, upon flowing of an electric current from the through conductor 8, 8a to the connection pad 7, 7a, the electric current passes through the location immediately below the end portion of the internal electrode 3 exposed at the surface of the multilayer body 2. This helps render the connection pad 7, 7a free of extra path length and thereby reduce the length of the path over which an electric current flows through the terminal electrode 4, 4a into the internal electrode 3, 3a. It is also possible to reduce the interval between the point at which the electric current flows into the internal electrode 3 and the terminal electrode 4a, namely the terminal electrode opposite from the terminal electrode 4 through which the electric current passes before flowing into the internal electrode 3, as well as the interval between the point at which the electric current flows into the internal electrode 3a and the terminal electrode 4, namely the terminal electrode opposite from the terminal electrode 4a through which the electric current passes before flowing into the internal electrode 3a. For example, as shown in FIGS. 2 and 3, in the case where the through conductors 8 and 8a are connected to the paired connection pads 7 and 7a, respectively, on which are mounted the terminal electrodes 4 and 4a, respectively, that are disposed at opposite end portions of the capacitor 5, the spacing between the through conductors 8 and 8a can be reduced in a planar view. As a result, the overall current path of the electronic apparatus 1 can be shortened with consequent ESL reduction.

Moreover, the state where the through conductor 8, 8a is located immediately below a part of the end portion of the internal electrode 3, 3a exposed at the lateral face of the multilayer body 2 in a planar view, the part lying furthermost from the end face refers to, for example, the state where part of the through conductor 8, 8a is in a position away from the end face at a certain distance so as to overlap with the internal electrode 3, 3a in a planar view.

It is especially preferable that, just as in the embodiment shown in FIG. 2, the through conductor 8, 8a is so disposed that, in a planar view, its central point is located immediately below a part of the end portion of the internal electrode 3, 3a which is exposed at the lateral face of the multilayer body 2, and half the area thereof is covered with the internal electrode 3, 3a. In this case, the electric current that has passed through the through conductor 8, 8a, the connection pad 7, 7a, and the terminal electrode 4, 4a is allowed to flow into the internal electrode 3, 3a over the shortest path as is desirable.

Moreover, in the multilayer body 2 of the embodiment shown in FIG. 2 in a planar view, for example, assuming that a direction parallel to the longer side (lateral-face side) thereof is a lateral direction and a direction parallel to the shorter side (end-face side) thereof is a longitudinal direction, then in the multilayer body 2, the longitudinal dimension thereof is 0.5 mm and the lateral dimension thereof is 1 mm. In the connection pad 7, 7a, the longitudinal dimension thereof is 0.5 mm and the lateral dimension thereof is 0.4 mm.

In the internal electrode 3, the length of its end portion exposed at the lateral face only of the multilayer body 2 is set at 0.25 mm in the lateral direction. The through conductor 8, 8a has a diameter of 80 μm in a planar view. The terminal electrode 4, 4a has a thickness of 25 μm. In the case where the terminal electrode 4, 4a and the connection pad 7, 7a are so designed that an end face of the former and a side of the latter coincide with each other in a planar view, the central point of the through conductor 8, 8a lies at a position which is spaced a distance of 0.265 mm away from the central point between a pair of the connection pads 7 and 7a (the center of gravity of the multilayer body 2 in a planar view) in the lateral direction and is spaced a distance of 0.185 mm away therefrom in the longitudinal direction in a planar view.

Moreover, in the embodiment shown in FIG. 2, at the side of one of the two lateral faces having the longer side of the multilayer body 2, in a planar view, the two through conductors 8 and 8a are each located immediately below a part of the end portion of the internal electrode 3, 3a exposed at the lateral face of the multilayer body 2, the part lying furthermost from the end face. More preferably, in contrast to the embodiment shown in FIG. 2, two through conductors 8 and 8a are formed at each of the lateral faces having the longer side of the multilayer body 2 so as to assume the aforementioned positions. In this case, since there are provided two current paths in parallel relation, it is possible to reduce ESL in the electronic apparatus 1 as a whole to 20 to 50% of the ordinary level.

Next, an electronic apparatus in accordance with a second embodiment of the invention will be described with reference to FIG. 4.

Figure 4:
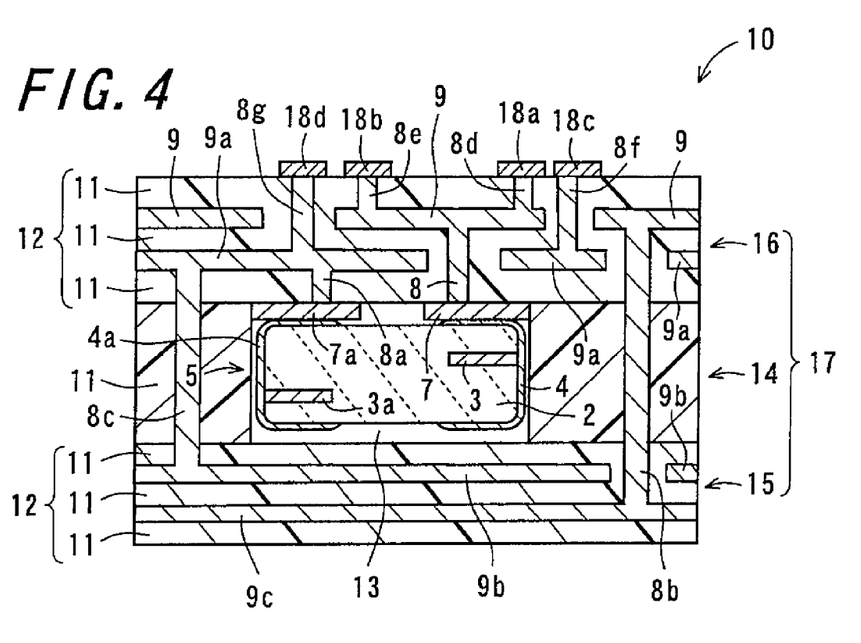
FIG. 4 is a longitudinal sectional view showing the electronic apparatus in accordance with a second embodiment of the invention.

FIG. 4 is a longitudinal sectional view showing the electronic apparatus in accordance with the second embodiment of the invention. In FIG. 4, there is shown the profile in longitudinal section of the electronic apparatus 10 of this embodiment including the capacitor 5 thus far described. Moreover, in FIG. 4, for example, on the upper surface of a multilayer circuit board 17, namely on the upper surface of a third multilayer circuit block 16, there are arranged electrode pads 18a, 18b, 18c, and 18d. At the time of mounting an electronic component such for example as an IC chip, terminals of this IC chip are connected to the electrode pads 18a through 18d.

As shown in FIG. 4, the electronic apparatus 10 of the present embodiment comprises the multilayer circuit board 17 and the capacitor 5. The multilayer circuit board 17 comprises an insulating base body 12, internal conductors 9, 9a, 9b, and 9c, and through conductors 8, 8a, 8b, 8c, 8d, 8e, 8f, and 8g. The insulating base body 12 is constituted of a plurality of insulating layers 11 stacked on top of each other. The internal conductors 9, 9a, 9b, and 9c are each formed between the corresponding ones of the insulating layers 11. The through conductors 8, 8a, 8b, 8c, 8d, 8e, 8f, and 8g are so formed as to pass through the insulating layers 11 so as to electrically connect the internal conductors 9, 9a, 9b, and 9c each formed between different ones of the plurality of the insulating layers 11. The multilayer circuit board 17 is composed of a first multilayer circuit block 14, a second multilayer circuit block 15, and the third multilayer circuit block 16. The first multilayer circuit block 14 is formed with a rectangular through hole 13. The second multilayer circuit block 15 is formed on a first main surface, namely the lower surface of the first multilayer circuit block 14. The third multilayer circuit block 16 is formed on a second main surface, namely the upper surface of the first multilayer circuit block 14. The third multilayer circuit block 16 comprises connection pads 7 and 7a formed on its first main surface, namely lower surface. The capacitor 5 is placed in the through hole 13 of the multilayer circuit board 17.

The capacitor 5 comprises a multilayer body 2, internal electrodes 3 and 3a, and terminal electrodes 4 and 4a. The multilayer body 2 is constituted of a plurality of rectangular dielectric layers stacked on top of each other. The internal electrode 3, 3a is formed between the dielectric layers of the multilayer body 2, with an end portion exposed at an area ranging from an end face to a middle portion of a lateral face in the multilayer body 2. The terminal electrodes 4 and 4a are formed at opposite ends of the multilayer body 2 and are connected to the internal electrodes 3 and 3a, respectively. The terminal electrode 4, 4a has an upper part extending to a first main surface of the multilayer body 2. The upper part of the terminal electrode 4, 4a is connected to the connection pad 7, 7a. In the third multilayer circuit block 16, in a planar view, the through conductor 8, 8a electrically connected to the connection pad 7, 7a is located immediately above a part of the end portion of the internal electrode 3, 3a exposed at the lateral face of the multilayer body 2, the part lying furthermost from the end face.

The second multilayer circuit block 15 comprises the internal conductors 9b and 9c. The third multilayer circuit block 16 comprises the internal conductors 9 and 9a. The internal conductor 9 and the internal conductor 9c are electrically connected to each other by the through conductor 8b passing all the way through the first multilayer circuit block 14. The internal conductor 9a and the internal conductor 9b are electrically connected to each other by the through conductor 8c passing all the way through the first multilayer circuit block 14. The electrode pad 18a and the internal conductor 9 are electrically connected to each other by the through conductor 8d. The electrode pad 18b and the internal conductor 9 are electrically connected to each other by the through conductor 8e. The electrode pad 18c and the internal conductor 9a are electrically connected to each other by the through conductor 8f. The electrode pad 18d and the internal conductor 9a are electrically connected to each other by the through conductor 8g.

In this construction, as has already been described, the length of the path over which an electric current flows from the through conductor 8, 8a into the internal electrode 3, 3a of the capacitor 5 can be reduced. This makes it possible to achieve ESL reduction in the electronic apparatus 10.

Moreover, since the capacitor 5 is not placed on the upper surface of the multilayer circuit board 17 but placed in the through hole 13 formed within the multilayer circuit board 17, it is possible to mount another electronic component on the upper surface of the multilayer circuit board 17. This allows electronic components to be mounted in a denser arrangement than ever.

Moreover, while the insulating base body 12 of the multilayer circuit board 17 may be formed of a material analogous to that used for the mounting board 6 described earlier, alternatively, a material obtained by impregnating thermosetting resin with an inorganic filler can be used as an insulating layer material. As the thermosetting resin, for example, polyphenylene ether-based resin or epoxy-based resin is used. As the inorganic filler, silicon dioxide, alumina, or the like is used.

Next, a description will be given below as to an example of methods of manufacturing the electronic apparatus 10 incorporating the capacitor 5 as shown in FIG. 4.

To begin with, the first multilayer circuit block 14, the second multilayer circuit block 15, and the third multilayer circuit block 16 are fabricated.

Firstly, in order to form the insulating layers 11, 80 to 150 μm-thick uncured insulating sheets made of a material of a mixture of thermosetting resin such as polyphenylene ether-based resin or epoxy-based resin and an amorphous inorganic filler such as silicon dioxide or alumina are obtained by a doctor blade method, for example.

Next, the internal conductors 9, 9a, 9b, and 9c are formed on the surfaces of the insulating sheets. The method adopted to form the internal conductors 9, 9a, 9b, and 9c involves a step of transferring metal foil such as copper foil or Al foil to the surfaces of the insulating sheets and a step of forming predetermined internal conductor patterns by carrying out a photoresist application process, an exposure process, a development process, an etching process, and a photoresist removal process successively in the order named.

Next, a plurality of holes for forming through conductors are created in the insulating sheets serving as the insulating layers 11 by means of carbon dioxide laser, punching, or otherwise. Note that the through holes for forming the through conductors 8 and 8a to 8g shown in FIG. 4 are created only in the insulating sheets to be formed into the third multilayer circuit block 16.

Moreover, in constructing the first multilayer circuit block 14, the rectangular through hole 13 is formed therein to accommodate the capacitor 5.

Next, an electrically conductive paste containing Cu powder is charged into the holes for forming the through conductors 8 and 8a to 8g, etc. in the insulating sheets to form the through conductors 8 and 8a to 8g, etc.

Next, a plurality of the insulating sheets thereby obtained are stacked on top of each other to form each of the first multilayer circuit block 14, the second multilayer circuit block 15, and the third multilayer circuit block 16. At this time, a molded laminate of a stack of a plurality of insulating layers is subjected to application of heat and pressure under conditions of a temperature of between 170° C. and 240° C. and a pressure of between 120 kPa and 400 kPa. In this way, the plurality of insulating layers can be stacked on top of and bonded to each other under pressure.

Next, on the lower surface of the third multilayer circuit block 16 thereby fabricated are formed the connection pads 7 and 7a. The connection pad 7, 7a is electrically connected to the through conductor 8, 8a of the third multilayer circuit block 16. Note that, in a planar view, the through conductor 8, 8a of the third multilayer circuit block 16 is so formed as to lie immediately above a part of the end portion of the internal electrode 3, 3a exposed at the lateral face of the multilayer body 2, the part lying furthermost from the end face.

Next, the capacitor 5 is mounted on the third multilayer circuit block 16 by means of solder, with the upper part of the terminal electrode 4, 4a electrically connected to the connection pad 7, 7a.

Next, the first multilayer circuit block 14 is disposed under the third multilayer circuit block 16 so that the capacitor 5 is located in the rectangular through hole 13.

Next, the second multilayer circuit block 15 is disposed under the first multilayer circuit block 14 so that the capacitor 5 is housed within the rectangular through hole 13 completely.

After that, the first multilayer circuit block 14, the second multilayer circuit block 15, and the third multilayer circuit block 16 are subjected to application of heat and pressure for mutual connection. In this way, there is obtained the electronic apparatus 10 of the present embodiment.

Figure 5:
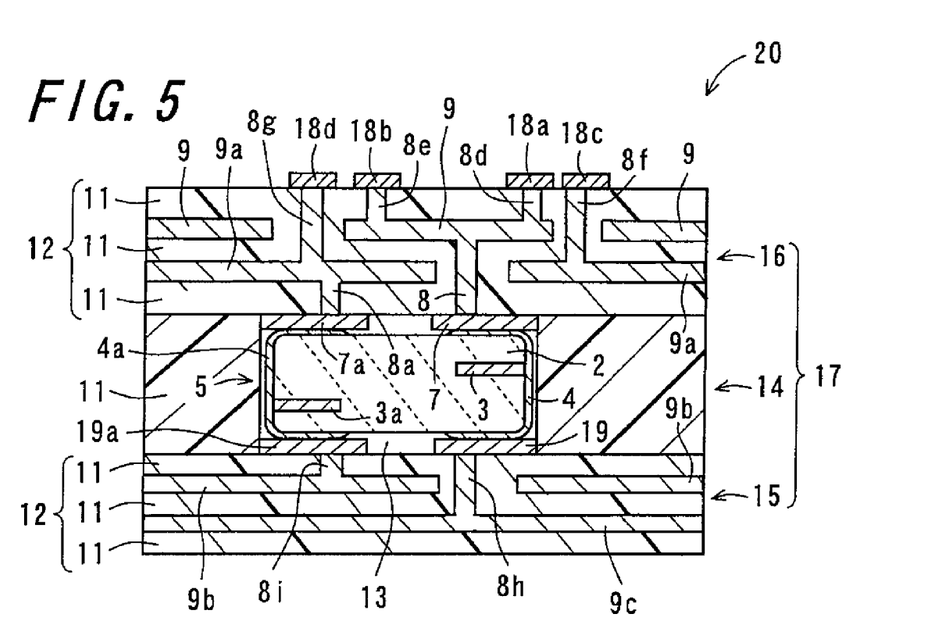
FIG. 5 is a longitudinal sectional view showing the electronic apparatus of a third embodiment of the invention.

Moreover, in FIG. 5, there is shown an electronic apparatus in accordance with a third embodiment of the invention. FIG. 5 is a longitudinal sectional view showing the electronic apparatus of the third embodiment of the invention. In FIG. 5, such constituent components as are common to those in FIG. 4 are represented by the same reference symbols. For example, on the upper surface of the multilayer circuit board 17, namely on the upper surface of the third multilayer circuit block 16, there are arranged electrode pads 18a through 18d. At the time of mounting an electronic component such for example as an IC chip, terminals of this IC chip are connected to the electrode pads 18a through 18d.

In the electronic apparatus 20 of this embodiment, second connection pads 19 and 19a are formed on the upper surface, which is defined as a first main surface, of the second multilayer circuit block 15. The terminal electrode 4, 4a of the capacitor 5 has a lower part extending to a second main surface of the multilayer body 2. The lower part of the terminal electrode 4, 4a is connected to the second connection pad 19, 19a. In the second multilayer circuit block 15, in a planar view, a through conductor 8h, 8i electrically connected to the second connection pad 19, 19a is located immediately below a part of the end portion of the internal electrode 3, 3a exposed at the lateral face of the multilayer body 2, the part lying furthermost from the end face.

In this construction, for example, on the upper surface of the multilayer circuit board 17, namely on the upper surface of the third multilayer circuit block 16, there are arranged electrode pads 18a through 18d for electrical connection with through conductors 8d through 8g. An electronic component such for example as an IC chip is mounted on the upper surface of the third multilayer circuit block 16, with its terminal connected to the electrode pad 18. Thereby, in the case of delivering an electric current from the second multilayer circuit block 15 to the electronic component such as an IC chip, the second connection pad 19, 19a on the upper surface of the second multilayer circuit block 15 and the connection pad 7, 7a on the lower surface of the third multilayer circuit block 16 are electrically connected to each other via the terminal electrode 4, 4a of the capacitor 5. This eliminates the need to form an extra through conductor within the first multilayer circuit block 14, with consequent miniaturization and cost reduction in the electronic apparatus 20.

EXAMPLES

Example 1

Now, examples of the electronic apparatus pursuant to the invention will be described below. Note that the electronic apparatus 1 shown in FIGS. 1 to 3 was fabricated by way of this example.

To begin with, the capacitor 5 employed in the electronic apparatus 1 of Example 1 will be explained.

Firstly, a ceramic slurry was formed by using $TiO_2$—$Nd_2O_3$—$BaTiO_3$ powder. The ceramic slurry was shaped into ceramic green sheets serving as dielectric layers by the doctor blade method. The thickness of the dielectric layer was set at 5 μm, and the number of the dielectric layers to be stacked was set at 50.

Next, with use of an electrically conductive paste containing a Ag—Pd alloy, the internal electrodes 3 and 3a were formed in the thereby obtained ceramic green sheets by means of screen printing. The ceramic green sheets bearing the internal electrodes 3 and 3a were stacked on top of and bonded to each other under pressure thereby to form a molded laminate of the multilayer body 2. Note that the molded laminate of the multilayer body 2 was obtained by dividing a product formed by a so-called multiple-pieces forming technique into pieces.

Moreover, where the dimension of the molded laminate of the multilayer body 2 is concerned, assuming that a direction of from top to bottom of the multilayer body 2 (stacking direction) is a height direction and, in a planar view, a direction parallel to the longer side (lateral-face side) thereof is a lateral direction and a direction parallel to the shorter side (end-face side) thereof is a longitudinal direction, then the height, the lateral dimension, and the longitudinal dimension of the molded laminate of the multilayer body 2 are 0.5 mm, about 1 mm, and about 0.5 mm, respectively.

Moreover, the internal electrode 3, 3a was so designed that it had a thickness of 2 μm following the completion of firing, that its end portion was exposed at an area ranging from an end face to a middle portion of a lateral face in the multilayer body 2, that it was formed in a T-shape in a planar view, and that the length of the end portion thereof exposed at the lateral face of the multilayer body 2 was approximately 0.2 mm in the lateral direction.

Next, the molded laminate of the multilayer body 2 was fired at 1200° C., whereupon the multilayer body 2 in a sintered state was obtained.

Next, the multilayer body 2 thereby obtained was chamfered by means of barrel finishing.

Next, an electrically conductive paste was applied to both ends of the multilayer body 2 so that the film thickness fell in the range of 10 μm to 50 μm by means of dipping coating. The electrically conductive paste was baked for 1 hour at approximately 900° C. to form the terminal electrodes 4 and 4a. The electrically conductive paste was made of copper powder and binder resin. Moreover, the thickness of the terminal electrode 4, 4a was set at 25 μm.

Next, the surface of the terminal electrode 4, 4a was coated with a Ni plating layer. In this way, the capacitor 5 was obtained.

Next, the thereby obtained capacitor 5 was mounted on the mounting board 6, whereupon the electronic apparatus 1 of Example 1 was obtained. On the upper surface of the mounting board 6 were formed the connection pads 7 and 7a. The capacitor 5 was mounted on the mounting board 6, with its terminal electrode 4, 4a connected to the connection pad 7, 7a. Note that the terminal electrode 4 and the connection pad 7 were so designed that an end face of the former and a side of the latter coincided with each other in a planar view at the time of mounting. Moreover, the mounting board 6 had the through conductors 8 and 8a and the internal conductors 9 and 9a formed inside thereof.

Note that the through conductor 8, 8a had a diameter of 80 μm. In the multilayer body 2 shown in FIG. 2 in a planar view, assuming that a direction parallel to the longer side (lateral-face side) thereof was a lateral direction and a direction parallel to the shorter side (end-face side) thereof was a longitudinal direction, then, in a planar view, the central point of the through conductor 8, 8a lay at a position which is spaced a distance of 0.265 mm away from the central point (the center of gravity of the multilayer body 2 in a planar view) between a pair of the connection pads 7 and 7a in the lateral direction and was spaced a distance of 0.185 mm away therefrom in the longitudinal direction.

Moreover, in the connection pad 7, 7a, the lateral dimension thereof was 0.4 mm and the longitudinal dimension thereof was 0.5 mm.

Moreover, the mounting board 6 was constructed by impregnating glass cloth with epoxy resin. Further, the connection pad 7, 7a, the through conductor 8, 8a, and the internal conductor 9, 9a were each made of a Cu—Zn alloy.

Moreover, by way of a comparative example, in a planar view, the through conductor 8, 8a was located at a position spaced a distance of 0.04 mm toward an outer side from an inner side opposed to the outer side in the connection pad 7, 7a in a planar view, said outer side being situated near the end face of the terminal electrode mounted on the connection pad 7 connected with the through conductor 8, 8a. That is, in a planar view, the central point of the through conductor 8, 8a lay at a position which is spaced a distance of 0.14 mm away from the central point between a pair of the connection pads 7 and 7a in the lateral direction and is spaced a distance of 0 mm away therefrom in the longitudinal direction.

Moreover, in the electronic apparatus of Comparative Example, each internal electrode of the capacitor is not formed in a T-shape in a planar view, and the internal electrode has a rectangular shape as a whole. Further, in the rectangular internal electrode, one of its lengthwise opposite end portions is connected to the terminal electrode.

Moreover, the electronic apparatus of Comparative Example was identical in structure and dimension with the electronic apparatuses 1, 10, and 20 of the present example, except for the position of the through conductor 8, 8a and the shape of the internal electrode.

Then, a high-frequency voltage (1 V in rated voltage and 1 kHz to 1 MHz in frequency) has been applied to each of the electronic apparatus 1 of Example 1 and the electronic apparatus of Comparative Example, and ESL values were measured by means of measuring instrument (impedance analyzer).

According to the result of measurement, the ESL value of the electronic apparatus 1 of Example 1 was 0.36 nH, whereas the ESL value of the electronic apparatus of Comparative Example was 0.84 nH. In addition, the path length between the paired through conductors 8 was 0.8 mm in the electronic apparatus 1 of Example 1, whereas the path length between the paired through conductors was 2.1 mm in the electronic apparatus of Comparative Example.

In the electronic apparatus 1 of Example 1, the internal electrode 3, 3a has its end portion exposed at the area ranging from the end face to a middle portion of a lateral face in the multilayer body 2, and, in a planar view, the through conductor 8, 8a is located immediately below a part of the end portion of the internal electrode 3, 3a exposed at the lateral face of the multilayer body 2, the part lying furthermost from the end face. Accordingly, it was seen that the path length in the entire electronic apparatus 1 was reduced with consequent ESL reduction.

Note that, in a typical electronic apparatus, the smaller the ESL the higher the decoupling effect as is desirable.

Example 2

Now, another example of the electronic apparatus pursuant to the invention will be described below. Note that the electronic apparatus 10 shown in FIG. 4 was fabricated by way of this example. Moreover, as the capacitor 5 for use in the electronic apparatus 10 in accordance with this example of the invention, the capacitor adopted in Example 1 was used.

Firstly, in order to form the insulating layers 11, 100 μm-thick uncured insulating sheets made of a material of a mixture of epoxy resin as thermosetting resin and silicon dioxide as an inorganic filler were obtained by the doctor blade method.

Next, following the transfer of copper foil to the surfaces of the insulating sheets, a photoresist application process, an exposure process, a development process, an etching process, and a photoresist removal process were carried out successively in the order named. In this way, the internal conductors 9, 9a, 9b, and 9c were formed.

Next, a plurality of holes for forming through conductors were created in the insulating sheets serving as the insulating layers 11 by means of carbon dioxide laser. Note that the through holes for forming the through conductors 8 and 8a to 8g shown in FIG. 4 were created only in the insulating sheets to be formed into the third multilayer circuit block 16.

Moreover, in constructing the first multilayer circuit block 14, the rectangular through hole 13 was formed therein to accommodate the capacitor 5.

Next, an electrically conductive paste containing Cu powder was charged into the holes for forming the through conductors 8 and 8a to 8g, etc. to form the through conductors 8 and 8a to 8g, etc. Moreover, in FIG. 4, the through conductors 8b and 8c each act as a through conductor for power supply.

Next, a plurality of the insulating sheets thereby obtained were stacked on top of each other to form each of the first multilayer circuit block 14, the second multilayer circuit block 15, and the third multilayer circuit block 16. At this time, a molded laminate of a stack of the plurality of insulating layers was subjected to application of heat and pressure under conditions of a temperature of 200° C. and a pressure of 300 kPa. In this way, the plurality of insulating layers were stacked on top of and bonded to each other under pressure. Note that the first multilayer circuit block 14 is composed of a stack of six insulating sheets, the second multilayer circuit block 15 is composed of a stack of three insulating sheets, and the third multilayer circuit block 16 is composed of a stack of three insulating sheets.

Next, on the lower surface of the third multilayer circuit block 16 thereby fabricated were formed the connection pads 7 and 7a. The connection pad 7, 7a was then electrically connected to the through conductor 8, 8a of the third multilayer circuit block 16. Note that, in a planar view, the through conductor 8, 8a of the third multilayer circuit block 16 was so formed as to lie immediately above a part of the end portion of the internal electrode 3, 3a exposed at the lateral face of the multilayer body 2, the part lying furthermost from the end face.

Next, the capacitor 5 was mounted on the third multilayer circuit block 16 by means of solder, with the connection pad 7, 7a electrically connected to the upper part of the terminal electrode 4, 4a.

Next, the first multilayer circuit block 14 was disposed under the third multilayer circuit block 16 so that the capacitor 5 was located in the rectangular through hole 13.

Next, the second multilayer circuit block 15 was disposed under the first multilayer circuit block 14 so that the capacitor 5 was housed within the rectangular through hole 13 completely.

After that, the first multilayer circuit block 14, the second multilayer circuit block 15, and the third multilayer circuit block 16 were subjected to application of heat and pressure for mutual connection. In this way, there was obtained the electronic apparatus 10 of Example 2.

Note that, where the dimension of the rectangular through hole 13 was concerned, assuming that a direction of from top to bottom of the construction shown in FIG. 4 (a stacking direction of the dielectric layers 11) was a height direction and, in a planar view, a direction parallel to the longer side of the capacitor 5 was a lateral direction and a direction parallel to the shorter side thereof was a longitudinal direction, then the height, the lateral dimension, and the longitudinal dimension of the rectangular through hole 13 were 0.55 mm, 1.05 mm, and 0.55 mm, respectively.

Moreover, in the connection pad 7, 7a, the lateral dimension thereof was 0.4 mm and the longitudinal dimension thereof was 0.6 mm.

Note that the through conductor 8, 8a had a diameter of 80 μm, and its position relative to the connection pad 7, 7a was the same as in Example 1.

According to the electronic apparatus 10 of Example 2 thereby constructed, just as was the case with Example 1 described earlier, it was seen that the length of the path over which an electric current flowed from the through conductor 8, 8a into the internal electrode 3, 3a of the capacitor 5 was reduced, and this made it possible to achieve ESL reduction in the electronic apparatus 10.

Moreover, the capacitor 5 is not placed on the upper surface of the multilayer circuit board 17 but placed in the through hole 13 formed within the multilayer circuit board 17. It was thus seen that a space area capable of mounting of another electronic component on the upper surface of the multilayer circuit board 17 was increased.

Example 3

Now, still another example of the electronic apparatus pursuant to the invention will be described below. Note that the electronic apparatus 20 shown in FIG. 5 was fabricated by way of this example. Moreover, as the capacitor 5 for use in the electronic apparatus 20 of Example 3, the capacitor adopted in Example 1 was used.

Firstly, in order to form the insulating layers 11, 100 μm-thick uncured insulating sheets made of a material of a mixture of epoxy resin as thermosetting resin and silicon dioxide as an inorganic filler were obtained by the doctor blade method.

Next, following the transfer of copper foil to the surfaces of the insulating sheets, a photoresist application process, an exposure process, a development process, an etching process, and a photoresist removal process were carried out successively in the order named. In this way, the internal conductors 9, 9a, 9b, and 9c were formed.

Next, a plurality of holes for forming through conductors were created in the insulating sheets serving as the insulating layers 11 by means of carbon dioxide laser. Moreover, the through holes for forming the through conductors 8, 8a, and 8d to 8i shown in FIG. 5 were created only in the insulating sheets to be formed into the second multilayer circuit block 15 and the third multilayer circuit block 16.

Moreover, in constructing the first multilayer circuit block 14, the rectangular through hole 13 was formed therein to accommodate the capacitor 5.

Next, an electrically conductive paste containing Cu powder was charged into the holes for forming the through conductors 8, 8a, and 8d to 8i, etc. created in the insulating sheets to form the through conductors 8, 8a, and 8d to 8i, etc. Note that, in the electronic apparatus 20 of the present example, the second connection pad 19, 19a on the upper surface of the second multilayer circuit block 15 and the connection pad 7, 7a on the lower surface of the third multilayer circuit block 16 were electrically connected to each other via the terminal electrode 4, 4a of the capacitor 5. Therefore, the through conductors 8b and 8c for power supply were not formed therein.

Next, a plurality of the insulating sheets thereby obtained were stacked on top of each other to form each of the first multilayer circuit block 14, the second multilayer circuit block 15, and the third multilayer circuit block 16. At this time, a molded laminate of a stack of the plurality of insulating layers was subjected to application of heat and pressure under conditions of a temperature of 200° C. and a pressure of 300 kPa. In this way, the plurality of insulating layers were stacked on top of and bonded to each other under pressure.

Note that the first multilayer circuit block 14 is composed of a stack of six insulating sheets, the second multilayer circuit block 15 is composed of a stack of three insulating sheets, and the third multilayer circuit block 16 is composed of a stack of three insulating sheets.

Next, on the lower surface of the third multilayer circuit block 16 thereby fabricated were formed the connection pads 7 and 7a. The connection pad 7, 7a was electrically connected to the through conductor 8, 8a of the third multilayer circuit block 16. Note that, in a planar view, the through conductor 8, 8a of the third multilayer circuit block 16 was so formed as to lie immediately above a part of the end portion of the internal electrode 3, 3a exposed at the lateral face of the multilayer body 2, the part lying furthermost from the end face.

Next, the capacitor 5 was mounted on the third multilayer circuit block 16 by means of solder, with the upper part of the terminal electrode 4, 4a electrically connected to the connection pad 7, 7a.

Next, the first multilayer circuit block 14 was disposed under the third multilayer circuit block 16 so that the capacitor 5 was located in the rectangular through hole 13.

Next, the second connection pads 19 and 19a were formed on the upper surface of the second multilayer circuit block 15. The second connection pad 19, 19a was electrically connected to the through conductor 8h, 8i of the second multilayer circuit block 15. Note that, in a planar view, the through conductor 8h, 8i of the second multilayer circuit block 15 was so formed as to lie immediately below a part of the end portion of the internal electrode 3, 3a exposed at the lateral face of the multilayer body 2, the part lying furthermost from the end face.

Next, the second multilayer circuit block 15 was disposed under the first multilayer circuit block 14, with the second connection pad 19, 19a electrically connected to the lower part of the terminal electrode 4, 4a of the capacitor 5. In this way, the capacitor 5 was housed within the through hole 13 completely.

After that, the first multilayer circuit block 14, the second multilayer circuit block 15, and the third multilayer circuit block 16 were subjected to application of heat and pressure for mutual connection. In this way, there was obtained the electronic apparatus 20 of Example 3.

Note that, where the dimension of the rectangular through hole 13 was concerned, assuming that a direction of from top to bottom of the construction shown in FIG. 4 (a stacking direction of the dielectric layers 11) was a height direction and, in a planar view, a direction parallel to the longer side of the capacitor 5 was a lateral direction and a direction parallel to the shorter side thereof was a longitudinal direction, then the height, the lateral dimension, and the longitudinal dimension of the rectangular through hole 13 were 0.55 mm, 1.05 mm, and 0.55 mm, respectively.

Moreover, in the connection pad 7, 7a, the lateral dimension thereof was 0.4 mm and the longitudinal dimension thereof was 0.6 mm. Further, in the second connection pad 19, 19a, the lateral dimension thereof was 0.4 mm and the longitudinal dimension thereof was 0.6 mm.

Note that the through conductor 8, 8a of the third multilayer circuit block 16 and the through conductor 8h, 8i of the second multilayer circuit block 15 were each 80 µm in diameter, and their positions relative to the connection pad 7, 7a were the same as in Example 1.

According to the electronic apparatus 20 of Example 3 thereby constructed, just as was the case with Example 1 described earlier, it was seen that the length of the path over which an electric current flowed from the through conductor 8, 8a, 8h, 8i into the internal electrode 3, 3a of the capacitor 5 was reduced, and this made it possible to achieve ESL reduction in the electronic apparatus 20.

Moreover, in contrast to the electronic apparatus 10 of Example 2, the electronic apparatus 20 of Example 3 was in no need of the formation of the through conductors 8b and 8c for power supply as shown in FIG. 4. That is, it was seen that the electronic apparatus 20 of Example 3 could be made more compact than the electronic apparatus 10 of Example 2.

Thus, since the second connection pad 19, 19a on the upper surface of the second multilayer circuit block 15 and the connection pad 7, 7a on the lower surface of the third multilayer circuit block 16 are electrically connected to each other via the terminal electrode 4, 4a of the capacitor 5, there is no need to form the power-supply through conductors 8b and 8c required to deliver power from the second multilayer circuit block 15 to the third multilayer circuit block 16, with consequent miniaturization and cost reduction for the electronic apparatus 20.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An electronic apparatus comprising:
a capacitor comprising a multilayer body constituted of a plurality of rectangular dielectric layers stacked on top of each other, an internal electrode formed between the dielectric layers of the multilayer body, and a terminal electrode which is formed at both ends of the multilayer body and is connected to the internal electrode, the internal electrode comprising an end portion exposed at an area ranging from an end face to a middle portion of a lateral face in the multilayer body; and
a mounting board comprising a connection pad on a first main surface thereof and a through conductor which is connected to the connection pad and is formed inside thereof, the capacitor being mounted on the mounting board by connecting the terminal electrode of the capacitor to the connection pad, the through conductor being located immediately below a part of the end portion of the internal electrode exposed at the lateral face of the multilayer body of the capacitor in a planar view, the part lying furthermost from the end face.

2. An electronic apparatus comprising:
a multilayer circuit board comprising an insulating base body constituted of a plurality of insulating layers stacked on top of each other, internal conductors formed between the plurality of insulating layers, and a through conductor configured to pass through the insulating layers so as to electrically connect the internal conductors each formed between different ones of the plurality of insulating layers, the multilayer circuit board being composed of a first multilayer circuit block with a rectangular through hole, a second multilayer circuit block on a first main surface of the first multilayer circuit block, and a third multilayer circuit block on a second main surface of the first multilayer circuit block, the third multilayer circuit block comprising a connection pad on a first main surface thereof and a through conductor which is formed inside thereof and is connected to the connection pad; and
a capacitor which is placed in the through hole of the multilayer circuit board, and comprises a multilayer body constituted of a plurality of rectangular dielectric layers stacked on top of each other, an internal electrode formed between the dielectric layers of the multilayer body, with an end portion exposed at an area ranging from an end face to a middle portion of a lateral face in the multilayer body, and a terminal electrode which is formed at both ends of the multilayer body and is connected to the internal electrode, the terminal electrode extending to a first main surface of the multilayer body so as to make connection with the connection pad, wherein in the third multilayer circuit block, the through conductor is located immediately above a part of the end portion of the internal electrode exposed at the lateral face of the multilayer body of the capacitor in a planar view, the part lying furthermost from the end face.

3. The electronic apparatus according to claim 2, wherein a second connection pad is formed on a first main surface of the second multilayer circuit block, the terminal electrode of the capacitor which extends to a second main surface of the multilayer body and is connected to the second connection pad, and in the second multilayer circuit block, the through conductor electrically connected to the second connection pad is located immediately below a part of the end portion of the internal electrode exposed at the lateral face of the multilayer body in a planar view, the part lying furthermost from the end face.

* * * * *